United States Patent [19]

Iesaka

[11] Patent Number: 4,607,270
[45] Date of Patent: Aug. 19, 1986

[54] SCHOTTKY BARRIER DIODE WITH GUARD RING

[75] Inventor: Susumu Iesaka, Tokyo, Japan

[73] Assignee: Kabushiki Kaisha Toshiba, Japan

[21] Appl. No.: 618,952

[22] Filed: Jun. 8, 1984

[30] Foreign Application Priority Data

Jun. 16, 1983 [JP] Japan ................. 58-108126

[51] Int. Cl.⁴ ........................... H01L 29/48
[52] U.S. Cl. ..................... 357/15; 557/51; 557/52; 557/59; 557/68
[58] Field of Search ............ 357/52, 15, 59, 51, 357/53, 68

[56] References Cited

U.S. PATENT DOCUMENTS

| | | | |
|---|---|---|---|
| 3,694,719 | 9/1972 | Saxena | 357/52 |
| 3,890,698 | 6/1975 | Clark | 357/52 |
| 4,157,563 | 6/1979 | Bosselaar | 357/53 |

FOREIGN PATENT DOCUMENTS

| | | |
|---|---|---|
| 0021869 | 1/1981 | European Pat. Off. . |
| 0095184 | 11/1983 | European Pat. Off. . |
| 1960455 | 6/1971 | Fed. Rep. of Germany . |
| 2452209 | 7/1975 | Fed. Rep. of Germany . |
| 55-103763 | 8/1980 | Japan ................. 357/53 |
| 56-90565 | 7/1981 | Japan . |

OTHER PUBLICATIONS

IBM Technical Disclosure Bulletin, vol. 20 #8, p. 3197, Jan. 1978 "Schottky Barrier Diode With Isolated Guard Ring" by Jambotkar.

Primary Examiner—Andrew J. James
Assistant Examiner—Mark Prenty
Attorney, Agent, or Firm—Finnegan, Henderson, Farabow, Garrett & Dunner

[57] ABSTRACT

A guard-ring-equipped Schottky barrier diode, which has a shortened reverse recovery time and an increased withstand voltage, has a Schottky barrier layer formed on a semiconductor substrate, of a first conductivity type, and a guard ring, which has a second conductivity type, formed on surface of the substrate isolated from but surrounding the periphery of the barrier layer. An insulative film with an opening over part of the guard ring is formed over the region between the edge of the Schottky barrier layer and the guard ring. A high-resistance layer is formed in this opening and is connected with the Schottky barrier layer by a metal electrode. The width of the substrate between the guard ring and the edge of the barrier layer is less than the sum of the widths of the depletion layers of the guard ring and the barrier layer at the time when the lower voltage of either the barrier layer breakdown voltage or the guard ring breakdown voltage is applied.

6 Claims, 11 Drawing Figures

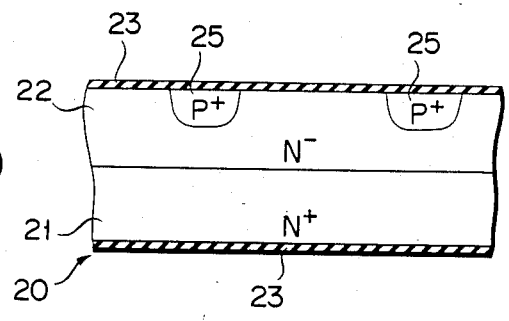
F I G. 2D
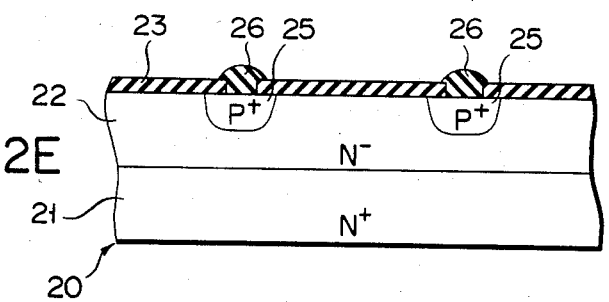
F I G. 2E
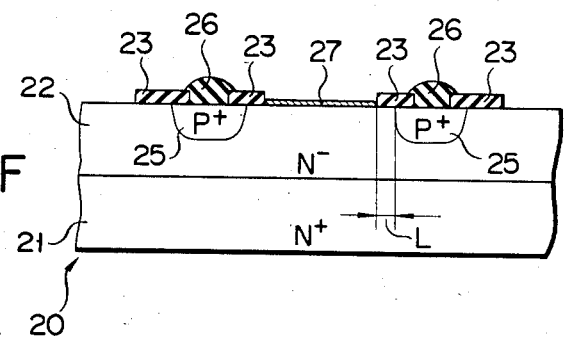
F I G. 2F
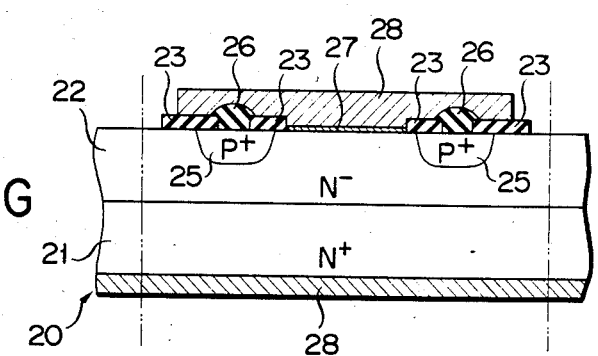
F I G. 2G

SCHOTTKY BARRIER DIODE WITH GUARD RING

BACKGROUND OF THE INVENTION

This invention relates to a Schottky barrier diode (hereafter referred to as an SBD) and, in particular, to an SBD with a guard ring that has a comparatively high withstand voltage.

SBDs have a low forward voltage drop and use majority carriers so the reverse recovery time is short. These characteristics make the SBD widely applicable as high-speed rectifying elements in power switching applications. Also, as SBDs are formed of a junction of a metal layer and a metal silicide layer on the surface of a semiconductor, an electrical field is formed around the ends of the metal and silicide layers. In order to increase the withstand voltage, an SBD is provided with a guard ring 2, as is shown in FIG. 1. An N− epitaxial layer 4 is formed on an N+ semiconductor substrate 3 and on top of this, a Schottky barrier metal layer 1 is formed. Around the edges of layer 1 on the surface region of the epitaxial layer 4, the guard ring 2 is formed, which is a region with a conductivity opposite to that of which the epitaxial layer 4 is formed. An opening is formed in an insulating film 5, which is also formed on the upper surface of the epitaxial layer 4, and a metal electrode 6 is formed on top of the Schottky barrier layer 1. On the underside of the N+ semiconductor substrate 3 an electrode 7 is formed. In this kind of SBD, the electrical field concentration around the Schottky barrier metal layer 1 is reduced inside the guard ring 2.

In the prior art guard-ring-equipped SBD, the withstand voltage was in the 40 to 50 volt range so, for example, when used in power rectifying applications where the signal frequency is under 500 KHz, no particular problems occurred.

In recent years, however, the demand for SBDs having a withstand voltage of 100-200 V has occurred. If a device having a guard ring such as that shown in FIG. 1 is used without any modifications in such high-power applications, the reverse recovery time is extremely long and the particular features of the SBD are lost. Namely, when the specific resistance of the N− epitaxial layer 4 is increased in order to increase the withstand voltage, the forward voltage drop in the layer 4 also increases. This increase results both in the junction of the P+ guard ring 2 and the N− epitaxial layer 4 becoming forward biased and in a large number of minority carriers flowing from the P+ guard ring 2 to the N− layer 4. This influx of minority carriers in turn greatly increases the reverse recovery time of the SBD.

For example, the SBD shown in FIG. 1 has a withstand voltage of 40 V and a reverse recovery time of about 50 ns. If the specific resistance of the N− layer 4 is increased to give this particular SBD a withstand voltage of 200 V, the reverse recovery time would become 300 ns.

If, for example, a P+ guard ring was not provided, the reverse recovery time would decrease but, in such a case, an electrical field concentration would be produced around the Schottky barrier metal layer and stable withstand elements could not be obtained.

SUMMARY OF THE INVENTION

In consideration of the above, the purpose of the invention is to provide a Schottky barrier diode with a short reverse recovery time and a high withstand voltage.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, a Schottky barrier diode of this invention comprises a Schottky barrier layer, formed on a semiconductor substrate, of a first conductivity type; a guard ring of a second conductivity type formed in the surface region of the semiconductor substrate isolated from and surrounding the periphery of the Schottky barrier layer; an insulating film provided on the guard ring and the substrate region between the edge of the Schottky barrier layer and the guard ring, and an opening formed in the insulating film over part of the guard ring; a high-resistance layer provided in the opening in contact with the guard ring; and a metal electrode which connects the high-resistance layer and the Schottky barrier layer.

The width of the substrate region between the guard ring and the Schottky barrier layer is made smaller than the sum of the width of the depletion layers on the guard ring side and the barrier side when the lower voltage of either the guard ring breakdown voltage or the barrier breakdown voltage is applied.

In the SBD of this invention, as the guard ring and barrier layer are electrically connected by a high-resistance layer, a voltage drop occurs in this high-resistance layer at the time of conduction. Accordingly, even if the specific resistance of the N− epitaxial layer is increased to raise the withstand voltage of the device, the forward voltage in the guard ring can be kept low so there is virtually no flow of minority carriers into the high-resistance layer and the reverse recovery time is short.

The accompanying drawings, which are incorporated in and constitute a part of this specification, illustrate one embodiment of the invention and, together with the description, serve to explain the principles of the invention.

BRIEF DESCRIPTION OF THE DRAWINGS

FIGS. 2A to 2G show cross sections of the construction of the preferred embodiment of this invention in the various stages of manufacturing.

DETAILED DESCRIPTION OF THE PREFERRED EMBODIMENT

The following is a description, with reference to the drawings, of the preferred embodiment of this invention together with the manufacturing process.

Figure 1:
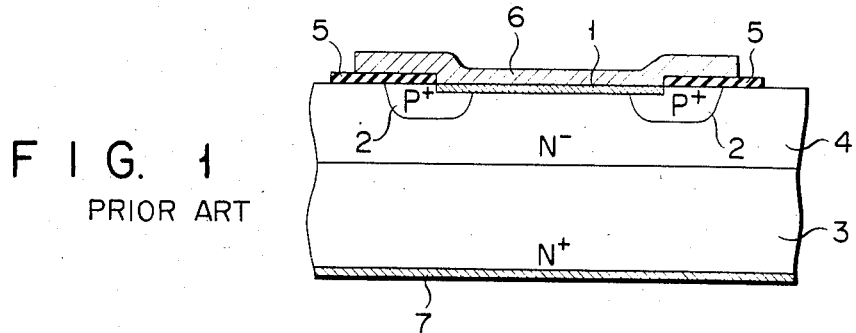
FIG. 1 shows a cross section of a prior art Schottky barrier diode equipped with a guard ring.
Figure 2A:
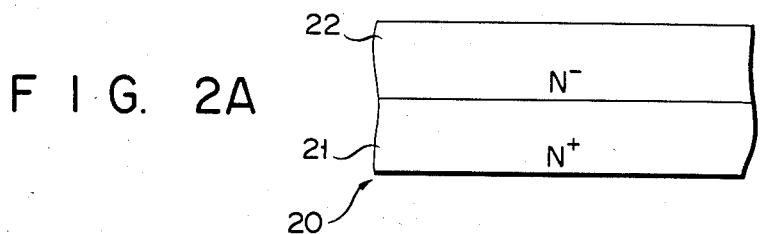
Figure 2B:
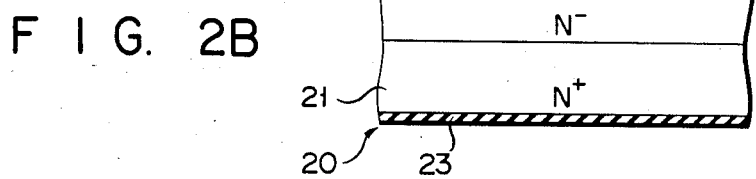
Figure 2C:
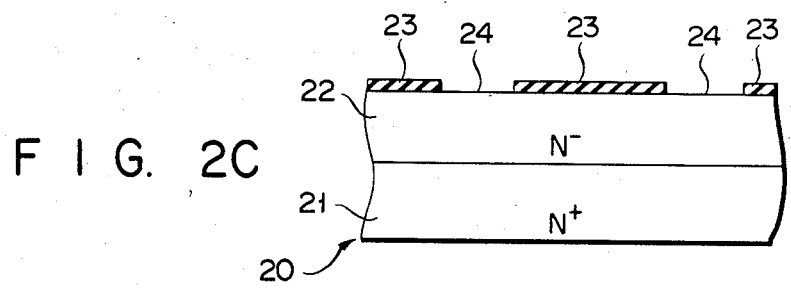

In FIG. 2A, a wafer 20 is shown with an N− epitaxial layer 22 of a specific resistance of about 5 Ω.cm grown to a depth of about 20 μm on an N+ silicon substrate 21. As shown in FIG. 2B, the wafer 20 is oxidized to form a 2 μm thick silicon oxide film 23 over the entire surface. Next, FIG. 2C shows openings 24 formed in a specified position of the film 23 using a photoetching process. After this, boron is diffused into the N− epitaxial layer 22 through the openings 24. Then, as shown in FIG. 2D, the wafer 20 is oxidized once more to re-form the silicon oxide film 23 over the entire surface of the substrate. The region into which boron has been diffused becomes the P+ guard ring 25, which has a thickness of about 5 μm.

Next, FIG. 2E shows the formation of openings in that part of the silicon oxide film 23 which is over the P+ guard ring 25, and the exposure of the layer 22. A polysilicon high-resistance layer 26 of $10^6$ to $10^8$ Ω.cm is grown in the exposed area by CVD (chemical vapour deposition). A polysilicon layer having such a high resistance can be formed by using a CVD reactant gas to which oxygen gas is added to a concentration of less than 10%.

As shown in FIG. 2F, the silicon oxide film 23 is removed from the inner side of the guard ring 25 such that the silicon oxide film 23 is left with a specified width around the inner periphery of the guard ring 25. The semiconductor substrate is then exposed. Next, a barrier metal such as platinum is formed on the exposed surface between the inner sides of the guard ring 25 by a vapour deposition method. By sintering the wafer 20 at a temperature of about 500° C., a Schottky barrier layer 27 of Pt silicide is formed. By leaving a specified width of silicon oxide film 23 around the inside of the guard ring 25, the Schottky barrier layer 27 and the guard ring 25 are isolated from each other. The width L of the region between the edge of the barrier layer 27 and the guard ring 25 is easy to manufacture with today's technology and, taking into consideration the yield rate, 5 to 8 μm is satisfactory.

In FIG. 2G, a metal electrode 28 of nickel or aluminium, etc., is shown formed on the lower surface of the wafer 20 and the upper surfaces of the barrier layer 27, the silicon oxide film 23, and the polysilicon 26. This wafer is cut along the chain line to produce an individual SBD pellet.

In a SBD produced in this way, the silicon oxide film 23 is formed on the substrate surface between the edges of the guard ring 25, the barrier layer 27 and the polysilicon 26, and a high-resistance layer is formed on the guard ring 25 to electrically connect the barrier layer 27 and the guard ring 25.

The forward voltage drop $V_F$ occurring at the barrier surface at rated use is, with platinum as the barrier metal, approximately 0.75 V. Also, by using platinum it is possible to increase the forward voltage and decrease the reverse current.

When the voltage applied to the guard ring is over about 0.65 V, the flow of minority carriers from the guard ring becomes large and, accordingly, it is sufficient for the high-resistance layer to keep this voltage below 0.6 V. For example, if the Schottky barrier surface is 2 mm×2 mm, the guard ring area 5% of the barrier area, the area of the opening formed in the silicon oxide layer on the guard ring $2\times10^{-3}$ cm², the thickness of the high-resistance layer 1 μm, and the specific resistance of the high-resistance layer about $3\times10^6$ Ω.cm, then a direct resistance of about 2.5 KΩ will be formed on the guard ring, and when the forward voltage drop of the device is 0.75 V, the voltage in the guard ring will not be over 0.6 V.

In this way, the SBD of this invention is able to suppress the forward bias of the guard ring 25 so that even if the specific resistance of N− epitaxial layer 22 is raised to increase the reverse withstand voltage, there is virtually no flow of minority carriers into polysilicon layer 26, and the reverse recovery time is in the 50 ns order.

Figure 3A:
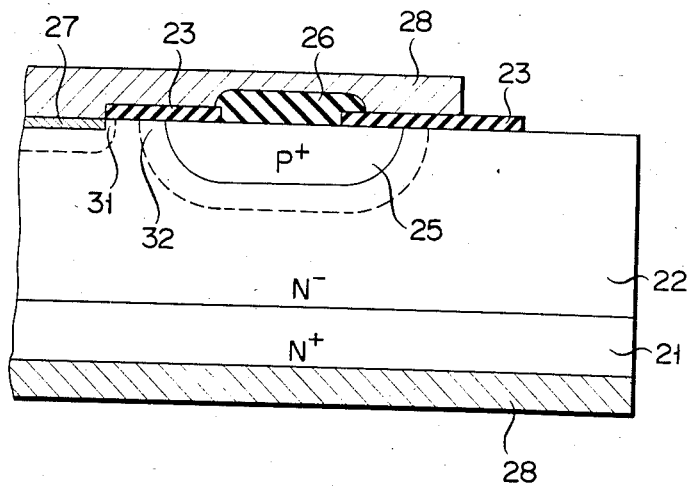
FIGS. 3A to 3C show the changes in the depletion layer of the embodiment of this invention when the withstand voltage is increased.
Figure 3B:
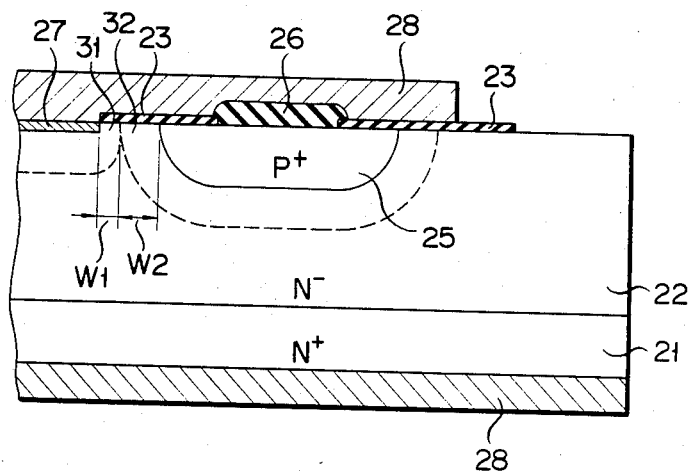
Figure 3C:
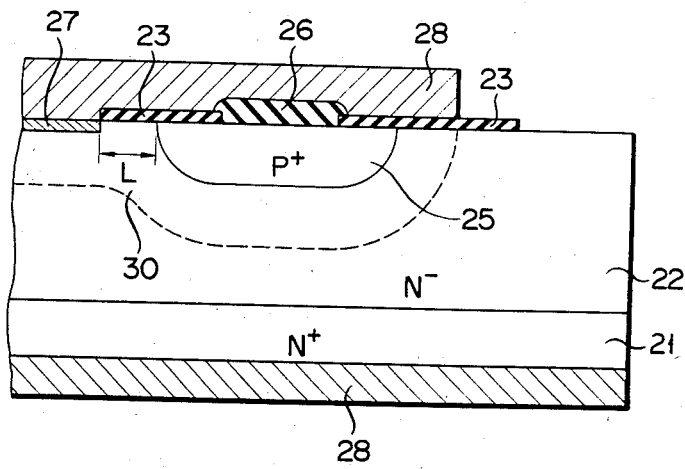

Next, when a reverse voltage is applied and that value amplified in the forward direction, the depletion layer between the guard ring 25 and the end of the barrier layer 27 gradually lengthens, as is shown in FIGS. 3A to 3C. While the reverse voltage is still small, the depletion layer 31 at the end of barrier layer 27 and the depletion layer 32 of the guard ring 25 are quite far apart, as shown in FIG. 3A, so a field concentration is produced at the end of the barrier layer. In this case, however, because the applied voltage is low, breakdown does not occur. As the applied voltage increases, the depletion layers 31 and 32 come into contact, as is shown in FIG. 3B, and as the voltage increases further, they join together, as shown in FIG. 3C, to form a depletion layer 30 that is the same as that of the prior art guard-ring equipped SBD. Then, even though the electrical field at the end of the barrier layer is over a certain level, the breakdown withstand voltage of the SBD is determined by the breakdown withstand voltage of the guard ring 25.

The width L of the substrate region between the guard ring 25 and the barrier layer 27 is, theoretically, set such that it is lower than the sum of the width $W_2$ of the depletion layer 32 on the guard ring 25 side and the width $W_1$ of depletion layer 31 on the barrier layer end side "$L < W_1 + W_2$" when the lower breakdown voltage of either the guard ring or the barrier layer is applied.

In practice, however, some leeway is given so $L \leq W_2$ (in the embodiment of this invention $L \approx 5$ μm, $W_2 \approx 15$ μm).

The characteristics of the SBD of this embodiment are a large withstand voltage of 200 V and a short reverse recovery time of less than 50 ns.

In the above embodiment, a metal electrode 28 extends from over the silicon oxide film 23 on the region on the outside of the guard ring 25 to cover the barrier layer 27. As the silicon oxide film 23 has a field plate structure, the substrate area directly underneath the metal electrode 28 is little affected by the positive ions in the film 23. Accordingly, compared with a device in which the metal electrode 28 extends from the barrier layer 27 to the polysilicon layer 26, this structure has an increased withstand voltage.

The polysilicon layer 26 is not limited to the above and may be any material that has a resistance sufficient to suppress the forward bias value of the guard ring 25.

What is claimed is:

1. A Schottky barrier diode, comprising:
   a Schottky barrier layer, formed on a semiconductor substrate, of a first conductivity type;
   a guard ring of a second conductivity type formed in the surface region of said semiconductor substrate isolated from and surrounding the periphery of said Schottky barrier layer;
   an insulating film provided on said guard ring and the substrate region between the edge of said Schottky barrier layer and said guard ring, and an opening formed over part of said guard ring;
   a high-resistance layer provided in said opening; and
   a metal electrode which connects said high-resistance layer and said Schottky barrier layer, the width of the substrate region between the edge of said Schottky barrier layer and said guard ring being less than the sum of the widths of the depletion layers on the Schottky barrier side and the guard ring side when the lower voltage of either the breakdown voltage of the guard ring or of the Schottky barrier is applied.

2. A Schottky barrier diode according to claim 1, wherein said high-resistance layer is polysilicon.

3. A Schottky barrier diode according to claim 1, wherein said metal electrode is formed on said insulating film covering the region of said Schottky barrier layer and outward to the outside of said guard ring.

4. A Schottky barrier diode according to claim 1 wherein said width of the substrate region is in the range of 5 $\mu$m to 8 $\mu$m.

5. A Schottky barrier diode, comprising:
 a Schottky barrier layer, formed on a semiconductor substrate, of a first conductivity type;
 a guard ring of a second conductivity type formed in the surface region of said semiconductor substrate isolated from and surrounding the periphery of said Schottky barrier layer;
 an insulating film provided on said guard ring and the substrate region between the edge of said Schottky barrier layer and said guard ring, and an opening formed in said insulating film over part of said guard ring;
 a high-resistance layer provided in said opening in contact with said guard ring; and
 a metal electrode which connects said high-resistance layer and said Schottky barrier layer.

6. A Schottky barrier diode according to claim 5 wherein the width of the substrate between the edge of said Schottky barrier layer and said guard ring is in the range of 5 $\mu$m to 8 $\mu$m.

* * * * *